United States Patent
Chuang et al.

(10) Patent No.: US 10,522,740 B2
(45) Date of Patent: Dec. 31, 2019

(54) TECHNIQUES FOR MRAM MTJ TOP ELECTRODE TO METAL LAYER INTERFACE INCLUDING SPACER

(71) Applicant: Taiwan Semiconductor Manufacturing Co., Ltd., Hsin-Chu (TW)

(72) Inventors: Harry-Hak-Lay Chuang, Zhubei (TW); Hung Cho Wang, Taipei (TW); Jiunyu Tsai, Hsinchu (TW); Sheng-Huang Huang, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 15/991,004

(22) Filed: May 29, 2018

(65) Prior Publication Data
US 2019/0371996 A1 Dec. 5, 2019

(51) Int. Cl.
*G11C 11/00* (2006.01)
*H01L 43/02* (2006.01)
*G11C 11/16* (2006.01)
*H01L 43/12* (2006.01)

(52) U.S. Cl.
CPC .......... *H01L 43/02* (2013.01); *G11C 11/161* (2013.01); *H01L 43/12* (2013.01)

(58) Field of Classification Search
CPC ........ H01L 43/02; H01L 43/12; G11C 11/161
USPC ........................................... 365/158
See application file for complete search history.

(56) References Cited

U.S. PATENT DOCUMENTS

| | | | |
|---|---|---|---|
| 9,502,466 B1* | 11/2016 | Chuang | H01L 27/222 |
| 9,666,790 B2* | 5/2017 | Chuang | H01L 27/228 |
| 9,818,935 B2* | 11/2017 | Chuang | H01L 43/12 |
| 9,893,278 B1* | 2/2018 | Chuang | H01L 27/222 |
| 10,038,137 B2* | 7/2018 | Chuang | H01L 43/08 |
| 10,164,169 B2* | 12/2018 | Chuang | H01L 45/04 |
| 2012/0205764 A1* | 8/2012 | Chen | G11C 11/16 257/422 |
| 2013/0119494 A1* | 5/2013 | Li | H01L 43/08 257/421 |
| 2015/0194602 A1 | 7/2015 | Liao et al. | |
| 2016/0027843 A1* | 1/2016 | Kumura | H01L 27/228 257/295 |
| 2016/0308119 A1 | 10/2016 | Hsu et al. | |
| 2017/0092692 A1 | 3/2017 | Kalnitsky et al. | |

(Continued)

*Primary Examiner* — Viet Q Nguyen
(74) *Attorney, Agent, or Firm* — Eschweiler & Potashnik, LLC

(57) ABSTRACT

Some embodiments relate to an integrated circuit including a magnetoresistive random-access memory (MRAM) cell. The integrated circuit includes a lower metal layer and an upper metal layer disposed over the lower metal layer. A bottom electrode is disposed over and in electrical contact with the lower metal layer. A magnetic tunneling junction (MTJ) is disposed over an upper surface of bottom electrode. A top electrode is disposed over an upper surface of the MTJ and is in contact with the upper metal layer. A sidewall spacer surrounds an outer periphery of the top electrode. An etch stop layer is disposed on top of an outer periphery of the spacer top surface and surrounding an outer periphery of the bottom surface of the upper metal layer. The etch stop layer overhangs the outer periphery of the spacer top surface.

17 Claims, 7 Drawing Sheets

(56) References Cited

U.S. PATENT DOCUMENTS

| | | |
|---|---|---|
| 2017/0117467 A1 | 4/2017 | Chang et al. |
| 2017/0207387 A1 | 7/2017 | Yang et al. |
| 2017/0222128 A1 | 8/2017 | Sung et al. |
| 2018/0040817 A1* | 2/2018 | Chuang ................. H01L 27/222 |

* cited by examiner

US 10,522,740 B2

TECHNIQUES FOR MRAM MTJ TOP ELECTRODE TO METAL LAYER INTERFACE INCLUDING SPACER

BACKGROUND

Many modern day electronic devices contain electronic memory. Electronic memory may be volatile memory or non-volatile memory. Non-volatile memory is able to retain its stored data in the absence of power, whereas volatile memory loses its stored data when power is lost. Magnetoresistive random-access memory (MRAM) is one promising candidate for next generation non-volatile electronic memory due to advantages over current electronic memory. Compared to current non-volatile memory, such as flash random-access memory, MRAM typically is faster and has better endurance. Compared to current volatile memory, such as dynamic random-access memory (DRAM) and static random-access memory (SRAM), MRAM typically has similar performance and density, but lower power consumption.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
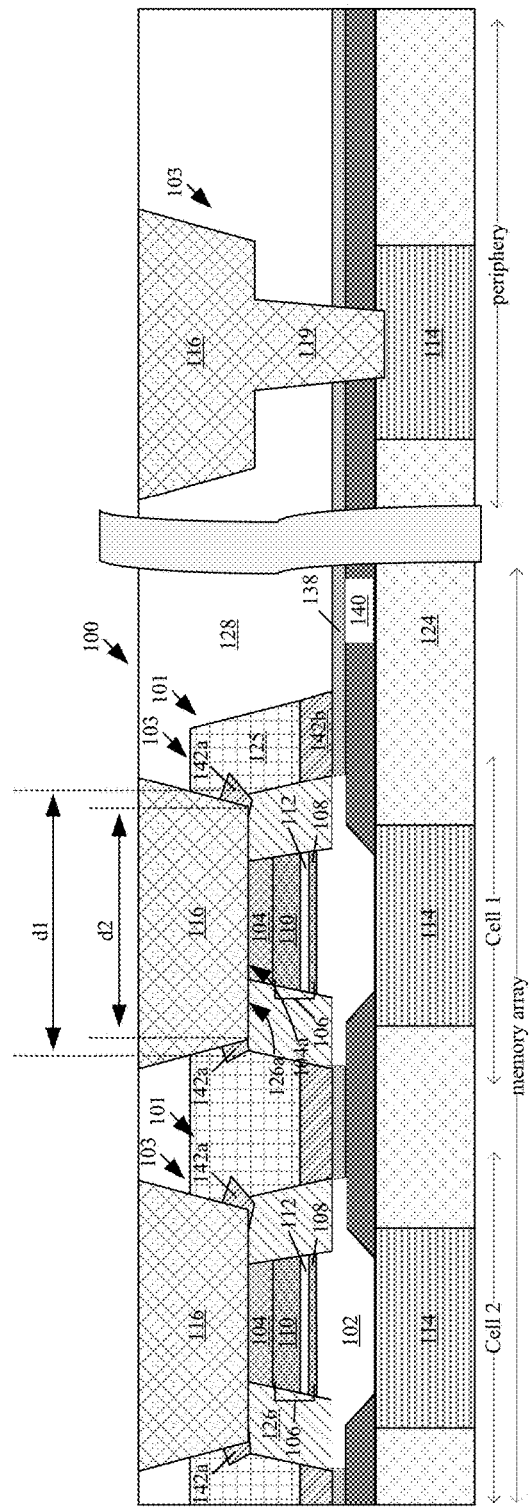
FIG. 1A illustrates a cross-sectional view of a portion of an electronic memory including some embodiments of an MRAM cell, including a magnetic tunneling junction (MTJ).

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A magnetoresistive random-access memory (MRAM) cell includes upper and lower electrodes, and a magnetic tunnel junction (MTJ) arranged between the upper and lower electrodes. In conventional MRAM cells, the upper electrode is coupled to an overlying metal layer (e.g., metal 1, metal 2, metal 3, etc.) by a contact or via. Although use of this coupling contact or via is widely adopted, the overall height of this MRAM cell plus this contact or via thereover is large relative to typical vertical spacing between adjacent metal layers (e.g., between a metal 2 layer and a metal 3 layer). To make this height more in line with the vertical spacing between adjacent metal layers, the present disclosure provides for techniques to couple the top electrode directly to an overlying metal line without a via or contact there between while avoiding possible MRAM shorting due to metal line overflow beyond a top surface of the MRAM cell and a bottom electrode of the MRAM cell.

Referring to FIG. 1A, a cross-sectional view of a portion of a memory device 100 that includes a memory array region and a periphery region. The memory region includes a metal layer-to-metal layer connection arrangement 103 for an MRAM cell 101 in accordance with some embodiments. Two MRAM cells 100 (cell 1 and cell 2) are illustrated, though like reference numerals are used to describe the MRAM cells 101 for convenience. The MRAM cells 101 include a bottom electrode 102 and a top electrode 104, which are separated from one another by a magnetic tunnel junction (MTJ) 106. In some embodiments, the bottom electrode 102 employs a multilayer structure (e.g., three layers) including a barrier layer of tantalum nitride or tantalum and two other layers of tantalum nitride or titanium nitride. The top electrode 104, the MTJ 106, and part of the bottom electrode 102 are surrounded by a sidewall spacer 126. The bottom and top electrodes 102, 104 are disposed between a lower metal layer 114 and an upper metal layer 116. The sidewall spacer 126 is surrounded by a protective layer 125, which can for example be made of silicon oxynitride (e.g., SiON), and a dielectric material such as an interlayer dielectric (ILD) or intermetal dielectric (IMD) layer 128 surrounds the protective layer 125. A dielectric liner 138, such as a silicon dioxide liner or silicon nitride liner, can conformally overlie a dielectric-protection layer 140. The dielectric-protection layer 140 electrically isolates the bottom electrode 102 from other active circuits and provides mechanical and chemical protection to the bottom electrode. In some embodiments the dielectric-protection layer is made of silicon dioxide ($SiO_2$) or silicon nitride ($Si_3N_4$).

The MTJ 106 includes a lower ferromagnetic electrode 108 and an upper ferromagnetic electrode 110, which are separated from one another by a tunneling barrier layer 112. In some embodiments, the lower ferromagnetic electrode 108 can have a fixed or "pinned" magnetic orientation, while the upper ferromagnetic electrode 110 has a variable or "free" magnetic orientation, which can be switched between two or more distinct magnetic polarities that each represents a different data state, such as a different binary state. In other implementations, however, the MTJ 106 can be vertically "flipped", such that the lower ferromagnetic electrode 108 has a "free" magnetic orientation, while the upper ferromagnetic electrode 110 has a "pinned" magnetic orientation.

In some embodiments, the sidewall spacer 126 includes a top spacer surface 126a which is at approximately the same height as a top electrode surface 104a of the top electrode 104. A portion of an etch stop layer 142a remains disposed atop the spacer top surface 126a and around an outer periphery of the upper metal layer 116. The etch stop layer 142a has a width d1 which is one factor that defines the width d2 of a bottom surface of the upper metal layer 116. The width d1 of the etch stop layer 142a is in part controlled by a width of the spacer top surface 126a, which supports the etch stop layer 142a when it is deposited. A lower portion of the etch stop layer 142b can be seen extending outward from a bottom of the sidewall spacer 126.

Figure 1C:
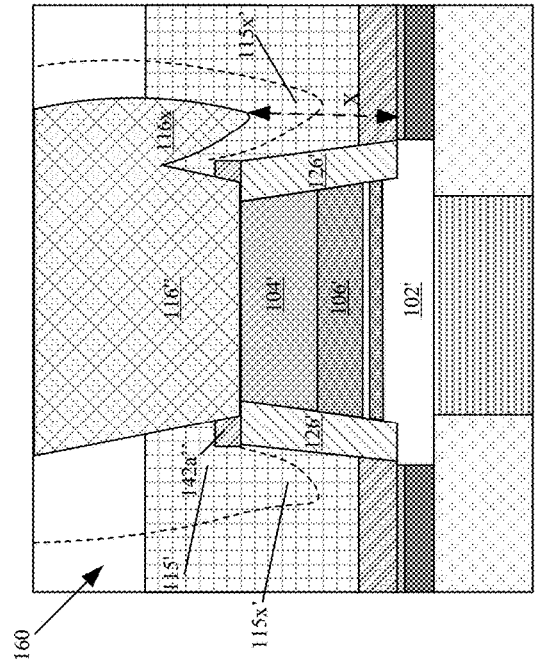
FIG. 1C illustrates a cross-sectional view of an MRAM cell exhibiting an undesired overflow of metal.
Figure 1B:
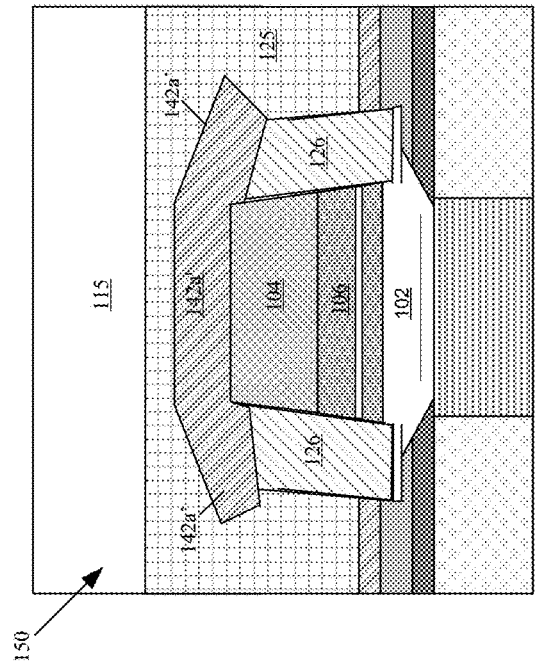
FIG. 1B illustrates a cross-sectional view of an MRAM cell illustrating a geometry of a stop layer deposited during manufacture of the MRAM cell.

FIG. 1B illustrates schematically how the width of the spacer top surface 126a controls the width of the etch stop layer 142a in an MRAM cell 150 in some embodiments. The etch stop layer 142a', 142b' can be made of silicon carbide (SiC) in some embodiments. The upper portion of the etch stop layer 142a' can include a central region directly over (and in some cases in direct contact with) the upper electrode 104, and a peripheral region that tapers or slants downward over the spacer 126. It can be seen that the etch stop layer 142a' extends slightly beyond the edges of the sidewall spacer 126. The etch stop layer 142a' has a "beret" like shape in that the etch stop layer includes a lateral extension that overhangs the spacer 126 to a significant degree. The portion of the etch stop layer 142a' that extends beyond the outer periphery of the spacer top surface angles slightly down toward the bottom metal layer. For the purposes of this description the term "overhanging etch stop layer" will be used as a shorthand to describe a beret shaped etch stop layer configured as shown in FIG. 1B. The overhanging etch stop layer 142a' may prevent unintentional etching of the protective layer 125 in a region that extends beyond an outer periphery of the sidewall spacer 126. When the etch stop layer 142a' is etched to form an opening for an upper metal layer, the opening will not extend beyond the etch stop layer 142a, thereby containing the upper metal layer within the opening and confining the upper metal layer to the region above the MRAM cell as can be seen in FIG. 1A.

In some MRAM fabrication processes, a titanium/titanium nitride layer is deposited on top of the top electrode 104 to prevent oxidation during manufacturing. This titanium/titanium nitride layer is removed by a subsequent photo/etch step. An advantage to depositing the stop layer 142a' on top of the top electrode 104 is that the complete coverage of the stop layer 142a' over the top electrode 104 may serve as sufficient oxidation prevention and thus may make the titanium/titanium nitride layer unnecessary. Accordingly, the use of the etch stop layer 142a' to prevent oxidation instead of the titanium/titanium nitride layer can save processing steps and cost.

FIG. 1C illustrates an example MRAM cell 160 that exhibits one potential difficulty presented by having direct contact between the top electrode 104' and the overlying metal layer 116' without a sufficiently wide sidewall spacer or stop layer. Sidewall spacer 126' is narrower than the sidewall spacer 126 of FIG. 1B. This means that the etch stop layer 142a" lacks lateral coverage (e.g., width) and may not provide sufficient protection against unintentional etching of the protective layer 125. It is possible that during etching to form the opening for the overlying metal layer 116' an unintended cavity may be formed if the etch extends slightly beyond the sidewall spacer 126'. If this cavity is filled with the overlying metal layer, a "tooth" 116x is formed and a weak point may be created (indicated by dashed arrow labeled X) that presents the possibility of a short between the tooth 116x and a bottom electrode 102' of the MRAM cell 160.

Returning to FIG. 1A, the MRAM cells 100 include a wider sidewall spacer 126 and etch stop layer 142a having sufficient width so that the connection between the metal layer 116 and the MRAM cell 100 will not extend beyond the top surface 126a of the sidewall spacer 126. This means that the risk of a short developing between the bottom electrode 102 and the overlying metal layer 116 is reduced. As will be appreciated, the features of FIG. 1A may provide reduced spacing between lower and upper metal layers 114, 116 due to direct contact between the top electrode 104 and upper metal layer 116, without an intervening via, and may also be amenable to streamlined manufacturing techniques.

Notably, rather than a contact or via coupling the top electrode 104 to an overlying metal layer 116, the top electrode 104 itself is in direct electrical contact with the overlying metal layer 116. In some embodiments, the overlying metal layer 116 is a metal line or metal layer jumper. In some embodiments, a bottom surface of the overlying metal layer 116 meets at a planar interface with a top surface 104a of the top electrode 104 and also portion of a top surface 126a of the sidewall spacer 126. Because there is no via or contact between the top electrode 104 and the overlying metal layer 116, the overall height of the MRAM cell 100 is more easily compatible with back-end-of-line (BEOL) process flows.

Figure 2:
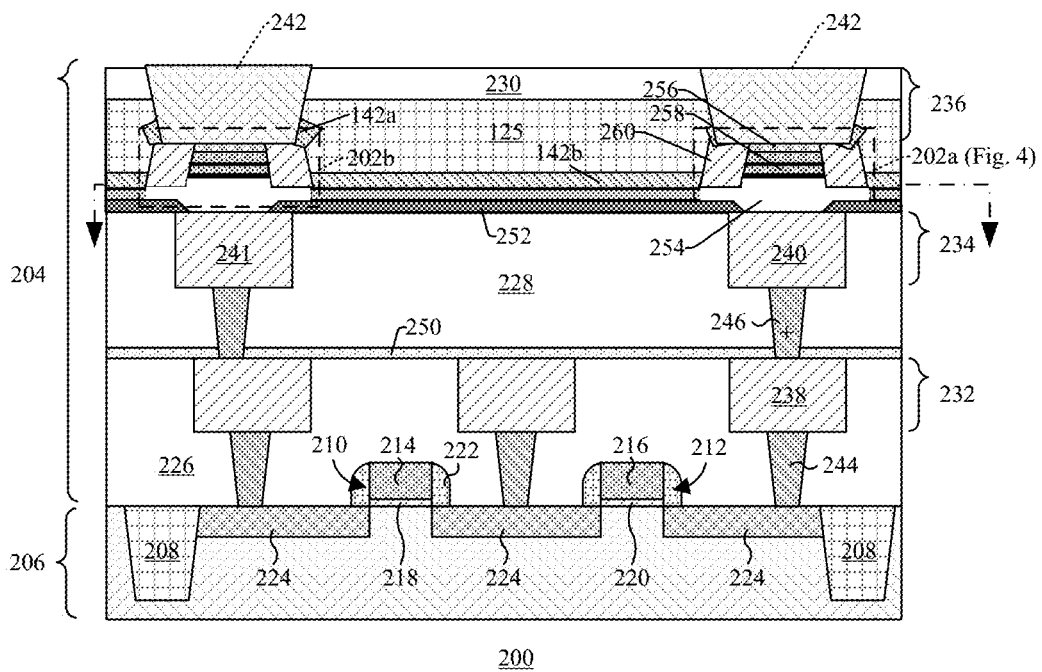
FIG. 2 illustrates a cross-sectional view of some embodiments of an integrated circuit including MRAM cells.

FIG. 2 illustrates a cross sectional view of some embodiments of an integrated circuit 200, which includes MRAM cells 202a, 202b disposed in an interconnect structure 204 of the integrated circuit 200. The integrated circuit 200 includes a substrate 206. The substrate 206 may be, for example, a bulk substrate (e.g., a bulk silicon substrate) or a silicon-on-insulator (SOI) substrate. The illustrated embodiment depicts one or more shallow trench isolation (STI) regions 208, which may include a dielectric-filled trench within the substrate 206.

Two word line transistors 210, 212 are disposed between the STI regions 208. The word line transistors 210, 212 include word line gate electrodes 214, 216, respectively; word line gate dielectrics 218, 220, respectively; word line sidewall spacers 222; and source/drain regions 224. The source/drain regions 224 are disposed within the substrate 206 between the word line gate electrodes 214, 216 and the STI regions 208, and are doped to have a first conductivity type which is opposite a second conductivity type of a channel region under the gate dielectrics 218, 220, respectively. The word line gate electrodes 214, 216 may be, for example, doped polysilicon or a metal, such as aluminum, copper, or combinations thereof. The word line gate dielectrics 218, 220 may be, for example, an oxide, such as silicon dioxide, or a high-K dielectric material. The word line sidewall spacers 222 can be made of silicon nitride (e.g., $Si_3N_4$), for example.

The interconnect structure 204 is arranged over the substrate 206 and couples devices (e.g., transistors 210, 212) to one another. The interconnect structure 204 includes a plurality of IMD layers 226, 228, 230, and a plurality of metallization layers 232, 234, 236 which are layered over one another in alternating fashion. The IMD layers 226, 228, 230 may be made, for example, of a low K dielectric, such as un-doped silicate glass, or an oxide, such as silicon dioxide, or an extreme low-k dielectric layer. The metallization layers 232, 234, 236 include metal lines 238, 240, 241, 242, which are formed within trenches, and which may be made of a metal, such as copper or aluminum. Contacts 244 extend from the bottom metallization layer 232 to the source/drain regions 224 and/or gate electrodes 214, 216; and vias 246 extend between the metallization layers 232, 234, 236. The contacts 244 and the vias 246 extend through dielectric-protection layers 250, 252 (which can be made of dielectric material and can act as etch stop layers during manufacturing). The dielectric-protection layers 250, 252 may be made of an extreme low-k dielectric material, such as SiC, for example. The contacts 244 and the vias 246 may be made of a metal, such as copper or tungsten, for example.

MRAM cells 202a, 202b, which are configured to store respective data states, are arranged within the interconnect structure 204 between neighboring metal layers. The MRAM cell 202a includes a bottom electrode 254 and a top electrode 256, which are made of conductive material. Between its top and bottom electrodes 256, 254, MRAM cell 202a includes an MTJ 258. MRAM cell 202a also includes a sidewall spacer 260. The metal line 242 has a lowermost surface that is co-planar with and in direct electrical contact with (e.g., ohmically coupled to) a top surface of top electrode 256 and portion of a top surface of the sidewall spacer 260.

Figure 3:
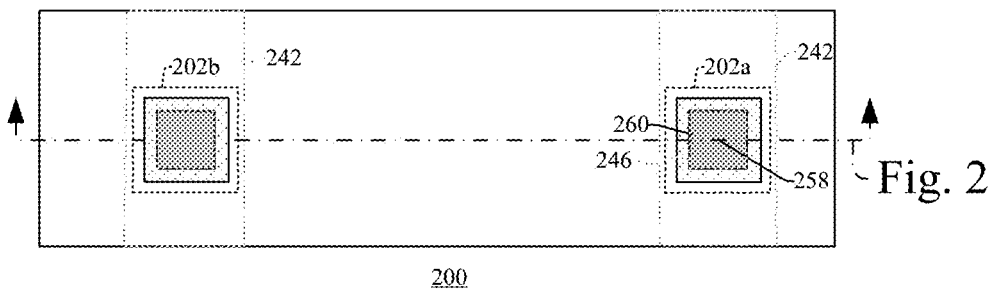
FIG. 3 illustrates a top view of some embodiments of FIG. 2's integrated circuit including MRAM cells.

FIG. 3 depicts some embodiments of a top view of FIG. 2's integrated circuit 200 as indicated in the cut-away lines shown in FIGS. 2-3. As can be seen, the MRAM cells 202a, 202b can have a square, rectangular, or circular shape when viewed from above in some embodiments. In other embodiments, however, for example due to practicalities of many etch processes, the corners of the illustrated square shape can become rounded, resulting in MRAM cells 202a, 202b having a square or rectangular shape with rounded corners, or having a circular or oval shape. The MRAM cells 202a, 202b are arranged over metal lines 240, 241, respectively, and have top electrodes 256 in direct electrical connection with the metal lines 242, respectively, without vias or contacts there between.

Figure 4:
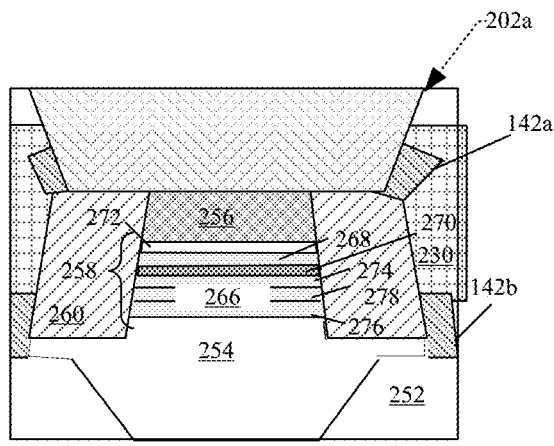
FIG. 4 illustrates an enlarged cross-sectional view an MRAM cell of FIG. 2's integrated circuit.

Referring now to FIG. 4, an enlarged cross-sectional view of FIG. 2's MRAM cell 202a is provided. As shown, the MRAM cell 202a includes bottom electrode 254 and top electrode 256 with MTJ 258 disposed between the bottom electrode 254 and top electrode 256. The bottom electrode 254 extends downwardly through in an opening in the dielectric-protection layer 252 to make electrical contact with underlying metal line 240.

In the illustrated embodiment, the MTJ 258 includes a lower ferromagnetic electrode 266 (which can have a pinned magnetic orientation) and an upper ferromagnetic electrode 268 (which can have a free magnetic orientation). A tunneling barrier layer 270 is disposed between the lower and upper ferromagnetic electrodes 266, 268; and a capping layer 272 is disposed over the upper ferromagnetic electrode 268. The lower ferromagnetic electrode 266 can be a synthetic anti-ferromagnetic (SAF) structure that includes a top pinned ferromagnetic layer 274, a bottom pinned ferromagnetic layer 276, and a metal layer 278 sandwiched between the top and bottom pinned ferromagnetic layers 274, 276.

In some embodiments, the upper ferromagnetic electrode 268 comprises Fe, Co, Ni, FeCo, CoNi, CoFeB, FeB, FePt, FePd, or the like. In some embodiments, the capping layer 272 comprises $WO_2$, NiO, MgO, $Al_2O_3$, $Ta_2O_5$, $MoO_2$, $TiO_2$, GdO, Al, Mg, Ta, Ru, or the like. In some embodiments, the tunneling barrier layer 270 provides electrical isolation between the upper ferromagnetic electrode 268 and the lower ferromagnetic electrode 266, while still allowing electrons to tunnel through the tunneling barrier layer 270 under proper conditions. The tunneling barrier layer 270 may comprise, for example, magnesium oxide (MgO), aluminum oxide (e.g., $Al_2O_3$), NiO, GdO, $Ta_2O_5$, $MoO_2$, $TiO_2$, $WO_2$, or the like.

In operation, the variable magnetic polarity of the upper (e.g., free) ferromagnetic electrode 268 is typically read by measuring the resistance of the MTJ 258. Due to the magnetic tunnel effect, the resistance of the MTJ 258 changes with the variable magnetic polarity. Further, in operation, the variable magnetic polarity is typically changed or toggled using the spin-transfer torque (STT) effect. According to the STT effect, current is passed across the MTJ 258 to induce a flow of electrons from the lower (e.g., pinned) ferromagnetic electrode 266 to the upper (e.g., free) ferromagnetic electrode 268. As electrons pass through the lower ferromagnetic electrode 266, the spins of the electrons are polarized. When the spin-polarized electrons reach the upper ferromagnetic electrode 268, the spin-polarized electrons apply a torque to the variable magnetic polarity and toggle the state of the free ferromagnetic electrode (e.g., upper electrode 268). Alternative approaches to reading or changing the variable magnetic polarity are also amenable. For example, in some alternate approaches magnetization polarities of the pinned and/or free ferromagnetic electrodes 266/268 are perpendicular to an interface between the tunneling barrier layer 270 and the pinned and/or free ferromagnetic electrode 266/268, making the MTJ 258 a perpendicular MTJ.

In the illustrated embodiment, because the top electrode 256 itself (as well as a portion of the sidewall spacer 260) is in direct contact with the overlying metal line 242, the overall height of the MRAM cells 202a, 202b can be reduced relative to previous approaches. This reduced height makes the MRAM cells 202a, 202b more easily compatible with BEOL process flows. Thus, formation of MRAM cells 202a, 202b provides better MRAM operations with reduced manufacturing cost. Further, because a bottom surface of the metal line is not as wide as the top surface of the spacer 260 the possibility of the metal line shorting to the bottom electrode 254 is reduced.

With reference to FIGS. 5 through 11, cross-sectional views of some embodiments of a semiconductor structure having an MRAM cell at various stages of manufacture are provided. Although FIGS. 5 through 11 are described as a series of acts, it will be appreciated that these acts are not limiting in that the order of the acts can be altered in other embodiments, and the methods disclosed are also applicable to other structures. In other embodiments, some acts that are illustrated and/or described may be omitted in whole or in part.

Figure 5:
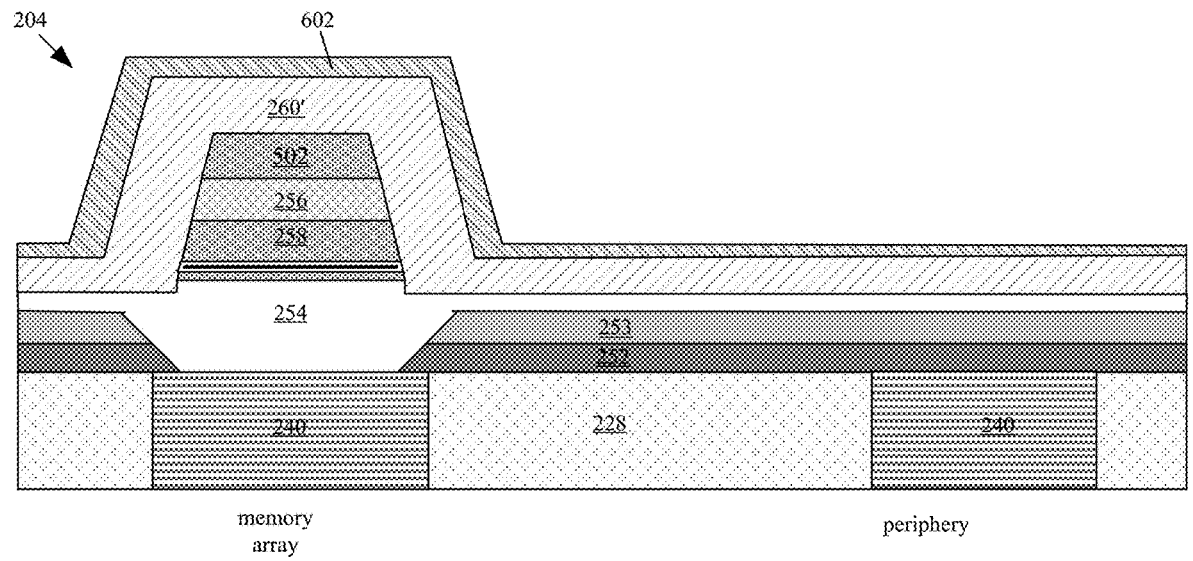
FIGS. 5 through 11 illustrate a series of incremental manufacturing steps as a series of cross-sectional views.

FIG. 5 illustrates a cross-sectional view of some embodiments illustrating a portion of an interconnect structure 204 disposed over a substrate (not shown in FIG. 5, but previously shown in FIG. 2). The interconnect structure 204 includes an IMD layer 228 and a metal line 240 which extends horizontally through the IMD layer 228. The IMD layer 228 can be an oxide, such as silicon dioxide, a low-K dielectric material, or an extreme low-K dielectric material. The metal line 240 can be made of a metal, such as aluminum, copper, or combinations thereof. In some embodiments, the substrate can be a bulk silicon substrate or a semiconductor-on-insulator (SOI) substrate (e.g., silicon on insulator substrate). The substrate can also be a binary semiconductor substrate (e.g., GaAs), a tertiary semiconductor substrate (e.g., AlGaAs), or a higher order semiconductor substrate, for example. In many instances, the substrate manifests as a semiconductor wafer, and can have a diameter of 1-inch (25 mm); 2-inch (51 mm); 3-inch (76 mm); 4-inch (100 mm); 5-inch (130 mm) or 125 mm (4.9 inch); 150 mm (5.9 inch, usually referred to as "6 inch"); 200 mm (7.9 inch, usually referred to as "8 inch"); 300 mm (11.8 inch, usually referred to as "12 inch"); 450 mm (17.7 inch, usually referred to as "18 inch"); for example. After processing is completed, for example after MRAM cells are formed, such a wafer can optionally be stacked with other wafers or die, and is then singulated into individual die which correspond to individual ICs.

A first dielectric-protection layer 252 is formed over TMD layer 228 and over metal line 240. In some embodiments, the first dielectric-protection layer 252 comprises SiC (silicon carbide) having a thickness of approximately 250 Angstroms. A second dielectric-protection layer 253 is formed over the first dielectric protection layer 252. In some embodiments, the second dielectric-protection layer has a different chemical composition than the first dielectric-protection layer 252, and can for example comprise SRO (silicon-rich oxide) having a thickness of approximately 200 Angstroms. A bottom electrode layer 254 is formed over the dielectric-protection layers 252, 253, and extends downwardly through an opening in the dielectric protection layers 252, 253 to make electrical contact with an upper portion of the metal line 240. The bottom electrode layer 254 may be a conductive material, such as, for example, titanium nitride, tantalum nitride, titanium, tantalum, or a combination of one or more of the foregoing. Further, the bottom electrode layer 254 may be, for example, about 10-100 nanometers thick in some embodiments.

A magnetic tunneling junction (MTJ) stack 258 is formed over an upper surface of the bottom electrode layer 254, and a top electrode layer 256 is formed over the MTJ stack 258. The top electrode layer 256 may be a conductive material, such as, for example, titanium nitride, tantalum nitride, titanium, tantalum, tungsten, or a combination of one or more of the foregoing. Further, the top electrode layer 256 may be, for example, about 10-100 nanometers thick. A mask 502 is disposed over an upper surface of the top electrode layer 256. In some embodiments, the mask 502 includes a photoresist mask, but can also be a hardmask such as a nitride mark. In some embodiments, the mask 502 may be may be a different conductive material as compared to the top electrode layer 256, such as, for example, titanium nitride, tantalum nitride, titanium, tantalum, or a combination of one or more of the foregoing. Sidewalls of the MTJ 258 and/or top electrode 256 can be angled at an angle of other than 90-degrees as measured relative to a normal line passing through an upper surface of the bottom electrode 254.

A sidewall spacer precursor layer 260' is formed over lateral portions of the bottom electrode 254, sidewalls of the MTJ 258, sidewalls of the top electrode 256, and extending over sidewalls and upper surface of the mask 502. In some embodiments, the sidewall spacer precursor layer 260' may be formed by any suitable deposition technique and is typically formed conformally. Further, the sidewall spacer precursor layer 260' may be formed of, for example, silicon nitride, silicon carbide, $Si_3N_4$, SiON, or a combination of one or more of the foregoing. Even more, the sidewall spacer precursor layer 260' may be formed with a thickness of, for example, about 150-600 Angstroms. A dielectric liner 602, such as a conformal oxide, is then formed over the sidewall spacer precursor layer 260'. The dielectric liner 602 facilitates the spacer etching process performed in FIG. 6.

Figure 6:
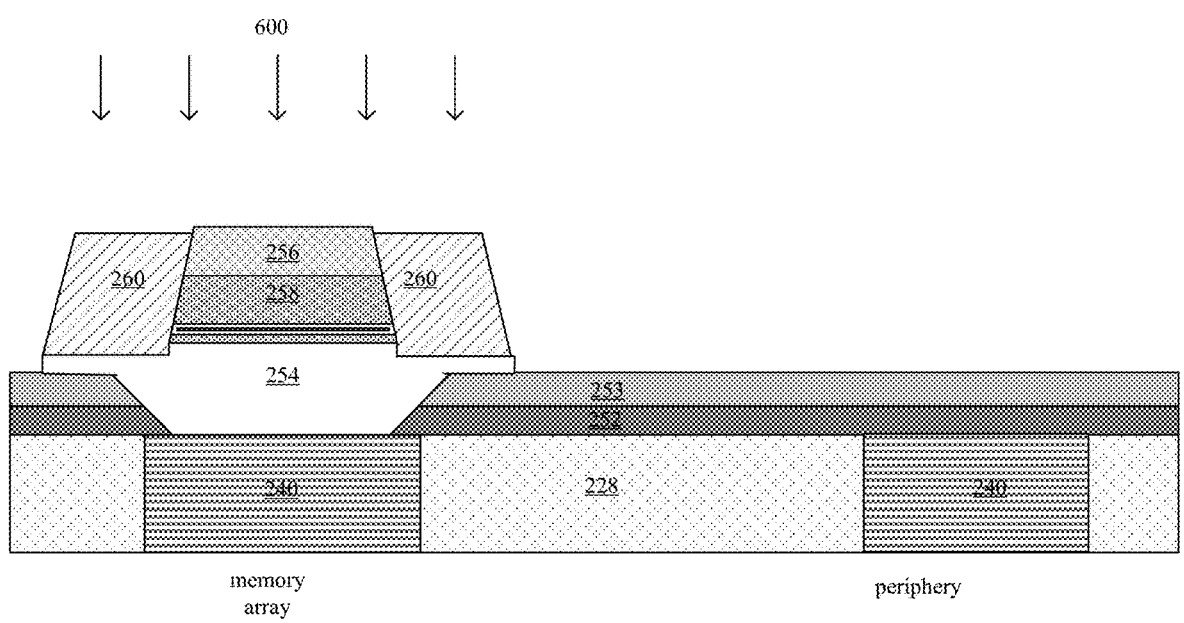

In FIG. 6, a spacer etching process 600 (e.g., anisotropic etch) has been performed into the sidewall spacer precursor layer 260' to etch sidewall spacer precursor layer 260' back to remove lateral stretches of the sidewall spacer precursor layer 260' and the top electrode mask layer 502 to expose a top surface 256 of the top electrode 256 surrounded by the remaining sidewall spacer 260. In some embodiments, after etching a sidewall spacer top surface and the electrode top surface have a combined width that is significantly wider than the expected width of a metal well or trench that will be formed in FIG. 10 to create the metal line (e.g., greater than 154 nm). Thus, in some embodiments, the width of the sidewall spacer is selected based on the width of the metal line to which the top electrode will be connected. In addition, the spacer etching process cuts the bottom electrode 254 to its final dimension. In some embodiments, this spacer etch 600 is a unidirectional or vertical etch.

Figure 7:
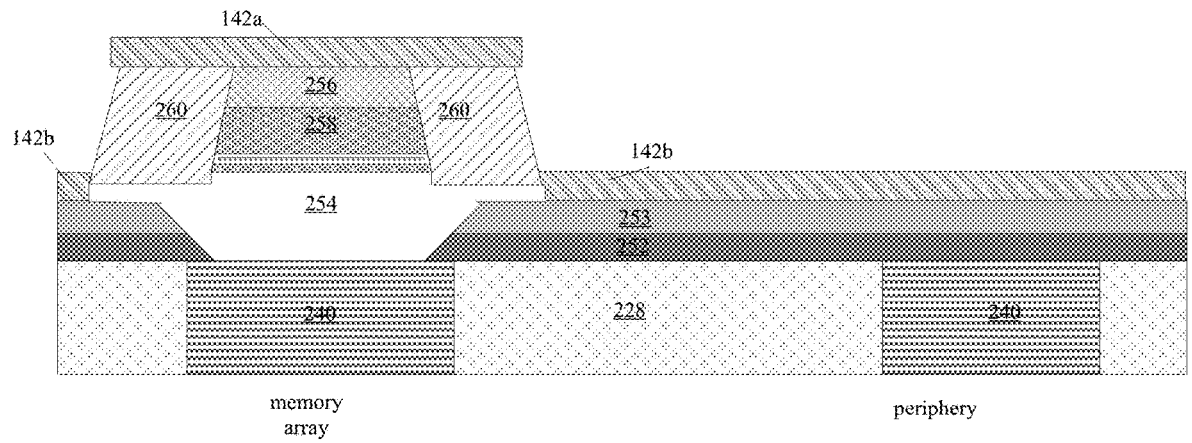

In FIG. 7, an etch stop layer is deposited to create a first portion 142a of the stop layer covering the electrode top surface and the spacer top surface. An additional portion 142b of the etch stop layer, which may be discontinuous with respect to the first portion 142a, abuts a periphery of the bottom electrode 254. This discontinuity in the stop layer is due to the step-like coverage characteristic of the stop layer material (e.g., silicon nitride, silicon carbide, $Si_3N_4$, SiON, or combinations thereof) which does not typically deposit on the lateral surface of the MTJ. Further, the first portion 142a overhangs the spacer top surface and, in some embodiments exhibits the beret shape, illustrated in FIG. 1B to provide additional lateral protection against unintentional etching beyond the spacer top surface.

Figure 8:
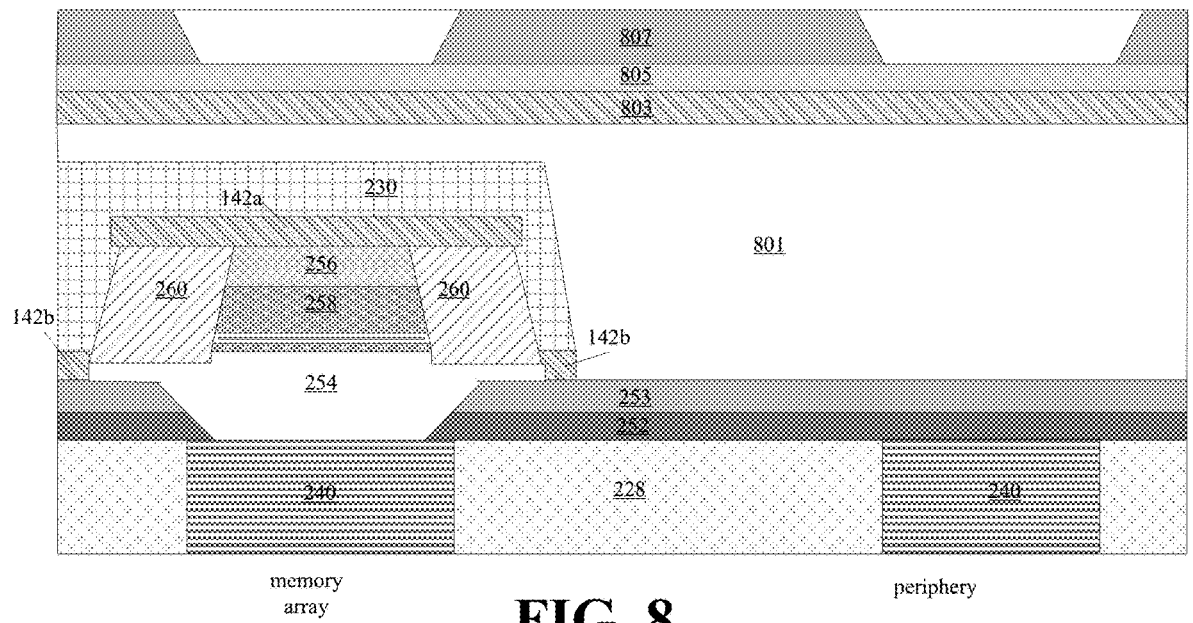

In FIG. 8 a protective layer 230, such as a silicon oxynitride (SiON) layer or an extreme low-k dielectric layer, is then formed over the etch stop layer 142a, 142b, for example, by chemical vapor deposition (CVD), plasma vapor deposition (PVD), spin on techniques, or thermal oxidation, for example. The protective layer 230 electrically isolates the MRAM cell from other active circuits and provides mechanical and chemical protection to the MRAM cell. In some embodiments, a top surface of the protective layer 230 is approximately 1080 Angstroms above a surface of the second dielectric-protection layer 253. In some embodiments, chemical mechanical planarization (CMP) is then performed on the protective layer 230 to planarize an upper surface of the protective layer 230. After the CMP, a photomask (not shown) is formed over the protective layer 230, and an etch is carried out so the protective layer 230 covers the memory array region and not the periphery region, as shown in FIG. 8.

Next an IMD or ILD layer 801 made of dielectric material, such as an oxide or ELK dielectric is applied on top of the protective layer 230 in the memory array region and on top of the second dielectric-protection layer 253 in the periphery region. In some embodiments, the IMD or ILD layer 801 has a thickness of approximately 400 Angstroms in the memory array region and approximately 1700 Angstroms in the periphery region. An etch stop layer 803 is deposited on the IMD or ILD layer 801. In some embodiments, the etch stop layer 803 comprises tetra-ethyl-orthosilicate (TEOS). A nitrogen free anti-reflection layer (NFARL) 805 is applied on top of the etch stop layer 803. In some embodiments, the NFARL 805 is approximately 200 Angstroms thick. A hard mask layer 807 is applied onto the NFARL 805. Photolithography is used to pattern the hard mask layer 807 with trench openings that will be used in a dual damascene process to form trenches or openings that will hold a top metal layer. In some embodiments, these openings can be dual-damascene openings. In some embodiments, the hard mask layer 807 comprises titanium nitride (TiN) and is approximately 350 Angstroms thick.

Figure 9:
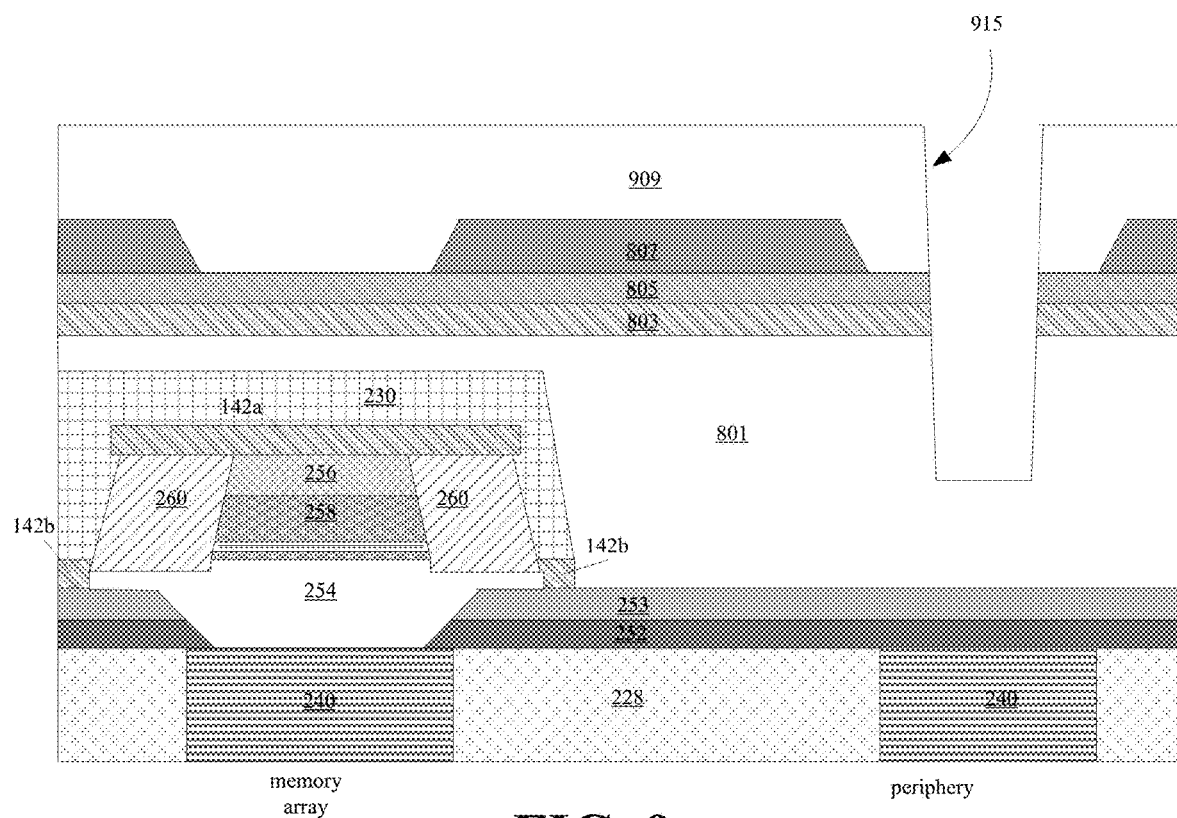

In FIG. 9, a photoresist layer 909 is applied over the hard mask layer 807. A first trench 915 is etched in the periphery region.

Figure 10:
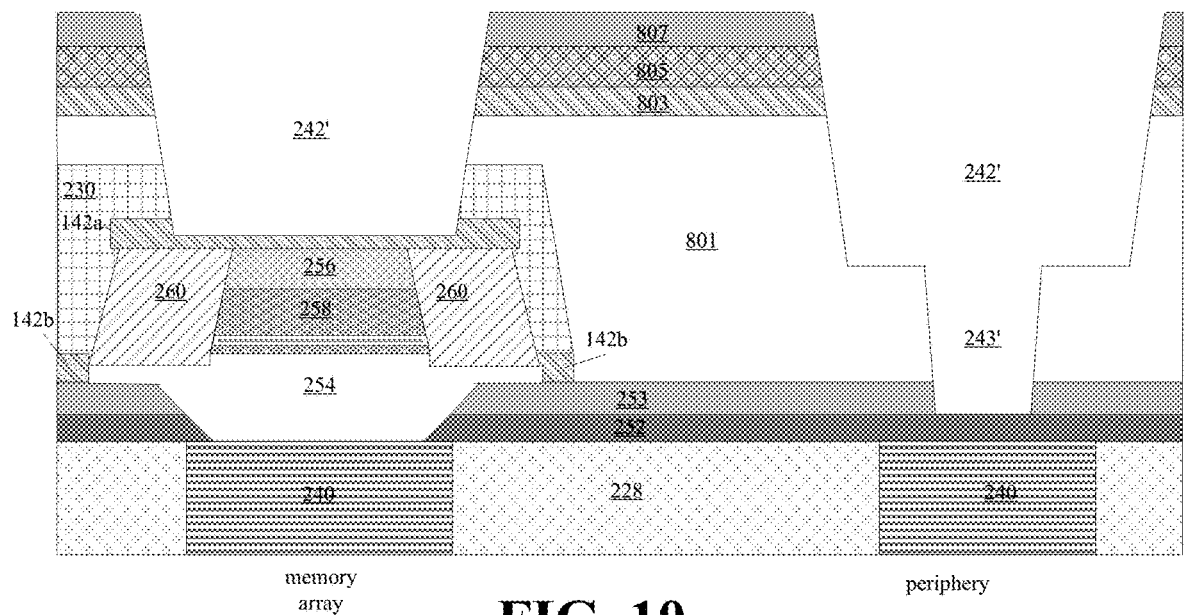

In FIG. 10, the photoresist layer 909 has been removed. One or more etches is then performed to form trench openings 242' and 243'. In some embodiments, the one or more etches comprise a dual damascene process.

Figure 11:
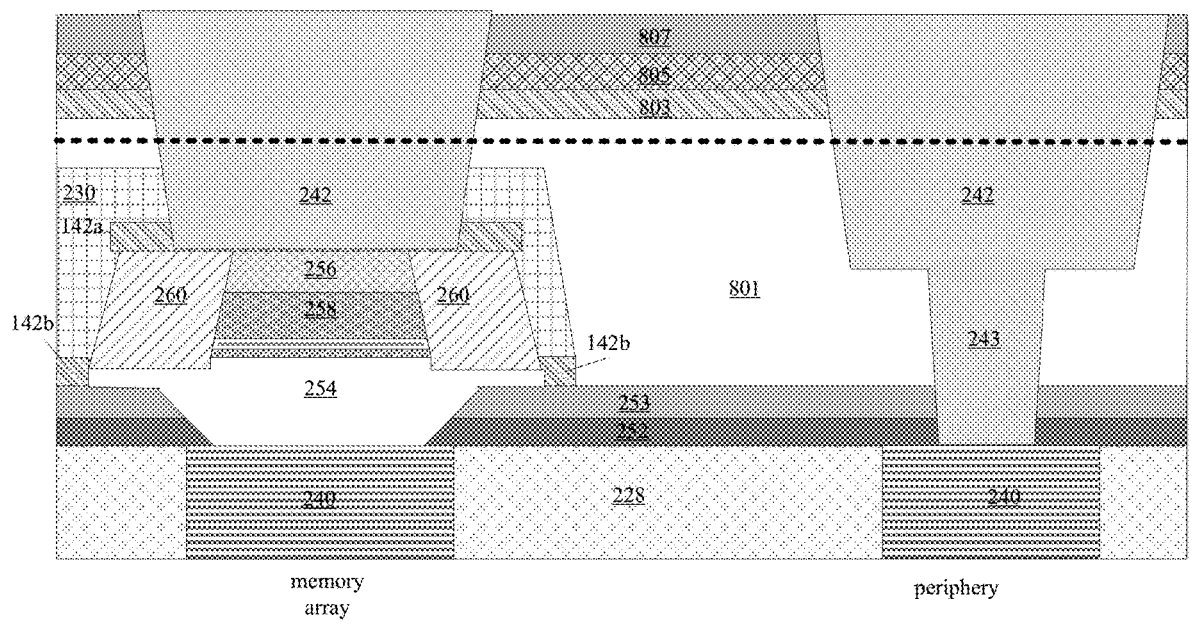

In FIG. 11, metal, such as aluminum or copper is used to fill the trenches and openings. Thus, in a memory array region, the trench is filled with a metal line 242 having a bottom surface which is in direct contact with the top surface of the top electrode 256, thereby providing an ohmic connection without a contact or via between the metal line 242 and top electrode 256. The bottom surface of the metal line is also in contact with a portion of the stop layer 142a, which reduces the risk of metal overflow beyond the MRAM cell. In some embodiments, the bottom surface of the metal line is in contact with less than an entirety of the stop layer. A CMP operation is then performed (as indicated by the dashed line) to planarize an upper surface of the metal lines and an upper surface of the dielectric-protection layer 801, thus resulting in the structure of FIGS. 1A and/or 4.

In another region of the integrated circuit, such as in the periphery region where CMOS logic devices are formed, a metal line 242 is coupled to an underlying metal line 240 through a via 243. As compared to the direct connection between the metal line 242 and the top electrode 256, the interposition of the via 243 between the metal layer 242 and the underlying metal line 240 consumes similar space in the vertical direction as the MRAM cell. Thus, the direct connection between the metal line 242 and top electrode 256 in the memory array region allows for a reduced cell height in the memory array region so that the cell height in the memory array region is similar to the cell height in the periphery region.

Figure 12:
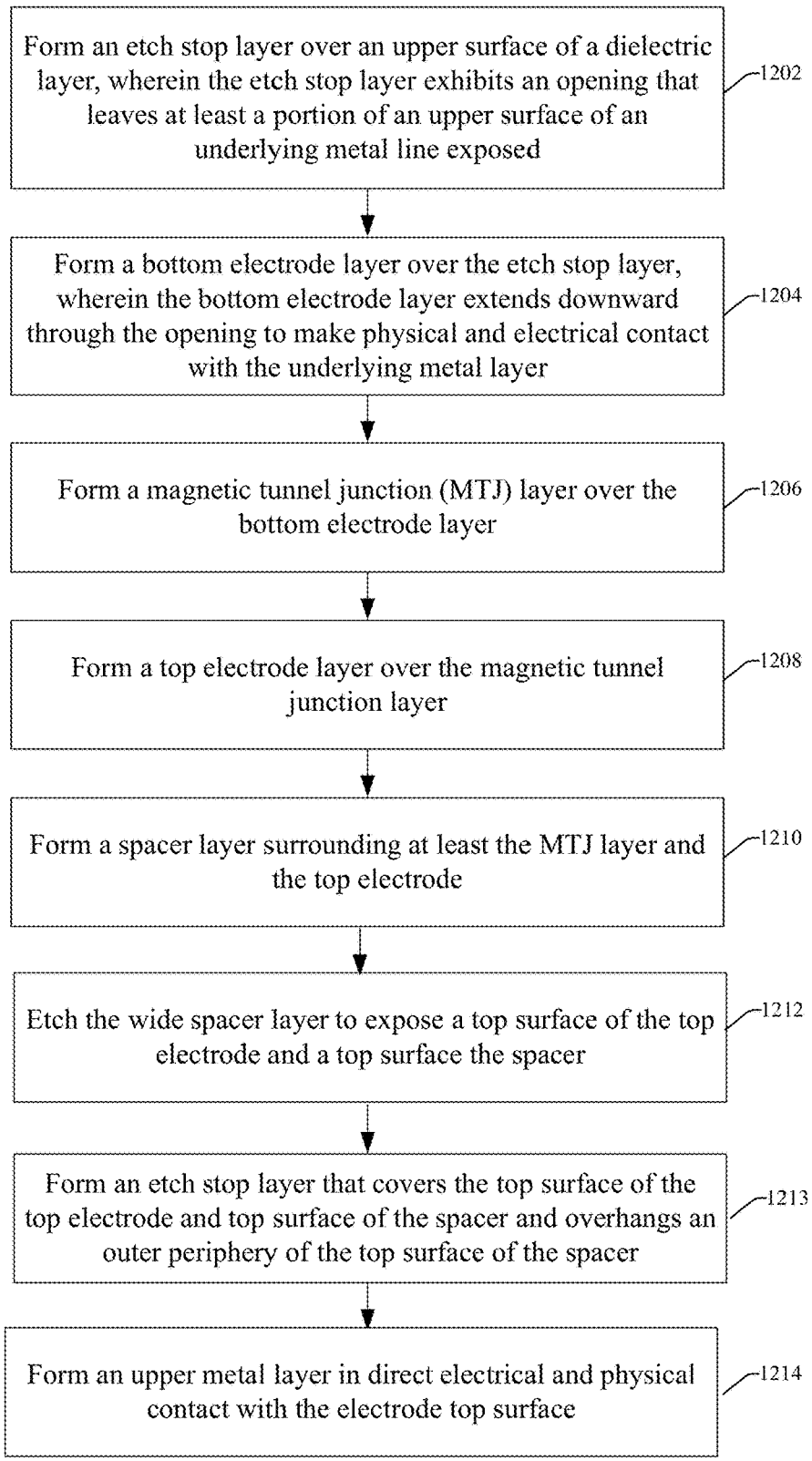
FIG. 12 illustrates a methodology in flowchart format that illustrates some embodiments of the present concept.

FIG. 12 illustrates a methodology 1200 of forming an MRAM cell having an etch stop layer of sufficient width to protect against unintentional etching beyond the sidewall spacer in accordance with some embodiments. Although this method and other methods illustrated and/or described herein are illustrated as a series of acts or events, it will be appreciated that the present disclosure is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

Acts 1202 through 1208 can correspond, for example, to the structure previously illustrated in FIG. 5 in some embodiments. At 1202, an etch stop layer is formed over an upper surface of a dielectric layer. The etch stop layer exhibits an opening that leaves at least a portion of an upper surface of an underlying metal line exposed. At 1204, a bottom electrode layer is formed over the etch stop layer. The bottom electrode layer extends downward through the opening to make physical and electrical contact with the underlying metal layer. At 1206, a magnetic tunnel junction (MTJ) layer is formed over the bottom electrode layer. At 1208, a top electrode layer is formed over the magnetic tunnel junction layer. At 1210, which can correspond to the example previously illustrated in FIG. 5, a wide spacer layer surrounding at least the MTJ layer and the top electrode is formed. The wide spacer layer is sufficiently wide to support an etch stop layer that protects against unintentional etching beyond a top surface of the spacer. At 1212, which can correspond to the example previously illustrated in FIG. 6, the spacer layer is etched to expose a top surface of the top electrode and a top surface of the spacer. At 1213, which can correspond to the example previously illustrated in FIG. 7, an etch stop layer that covers the top surface of the top electrode and the top surface of the spacer is formed. The etch stop layer overhangs an outer periphery of the top surface of the spacer. At 1214, which can correspond to the example previously illustrated in FIG. 11, an upper metal layer is formed to be in direct physical contact and electrical contact with the electrode top surface and the spacer top surface.

Some embodiments relate to an integrated circuit including a magnetoresistive random-access memory (MRAM) cell. The integrated circuit includes a semiconductor substrate and an interconnect structure disposed over the semiconductor substrate. The interconnect structure includes a plurality of dielectric layers and a plurality of metal layers that are stacked over one another in alternating fashion. The plurality of metal layers includes a lower metal layer and an upper metal layer disposed over the lower metal layer. A bottom electrode is disposed over and in electrical contact with the lower metal layer. A magnetic tunneling junction (MTJ) is disposed over an upper surface of the bottom electrode. A top electrode is disposed over an upper surface of the MTJ and has an electrode top surface in direct electrical contact with the upper metal layer. A sidewall spacer surrounds an outer periphery of the top electrode and has a spacer top surface. An etch stop layer is disposed on top of an outer periphery of the spacer top surface and surrounding an outer periphery of the bottom surface of the upper metal layer. The etch stop layer overhangs the outer periphery of the spacer top surface.

Other embodiments relate to an MRAM cell disposed on a semiconductor substrate. The MRAM cell includes a bottom electrode disposed over the semiconductor substrate, and a magnetic tunneling junction (MTJ) disposed the bottom electrode. A top electrode is disposed over an upper surface of the MTJ, wherein the top electrode has an electrode top surface. A sidewall spacer surrounds an outer periphery of the top electrode, wherein the spacer has a spacer top surface. A metal line is disposed over the top electrode and has a bottom surface in direct physical and electrical contact with the electrode top surface and at least a portion of the spacer top surface.

Other embodiments relate to a method for manufacturing an MRAM cell. In this method an etch stop layer is formed over an upper surface of a dielectric layer, wherein the etch stop layer exhibits an opening that leaves at least a portion of an upper surface of an underlying metal line exposed. A bottom electrode layer is formed over the etch stop layer. The bottom electrode layer extends downward through the opening to physically and electrically connect to the underlying metal line. A magnetic tunnel junction (MTJ) layer is formed over the bottom electrode layer. A top electrode is formed over the magnetic tunnel junction layer. A spacer layer is formed surrounding at least the MTJ layer and the top electrode. The spacer layer is etched to expose a top surface of the top electrode and a top surface of the spacer.

An upper metal layer is formed in direct electrical and physical contact with electrode top surface and the spacer top surface.

It will be appreciated that in this written description, as well as in the claims below, the terms "first", "second", "second", "third" etc. are merely generic identifiers used for ease of description to distinguish between different elements of a figure or a series of figures. In and of themselves, these terms do not imply any temporal ordering or structural proximity for these elements, and are not intended to be descriptive of corresponding elements in different illustrated embodiments and/or un-illustrated embodiments. For example, "a first dielectric layer" described in connection with a first figure may not necessarily correspond to a "first dielectric layer" described in connection with another figure, and may not necessarily correspond to a "first dielectric layer" in an un-illustrated embodiment.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit, comprising:
   a semiconductor substrate;
   an interconnect structure disposed over the semiconductor substrate, and including a plurality of dielectric layers and a plurality of metal layers stacked over one another in alternating fashion, wherein the plurality of metal layers include a lower metal layer and an upper metal layer disposed over the lower metal layer;
   a bottom electrode disposed over and in electrical contact with the lower metal layer;
   a magnetic tunneling junction (MTJ) disposed over an upper surface of the bottom electrode;
   a top electrode disposed over an upper surface of the MTJ, wherein the top electrode has an electrode top surface in direct electrical contact with a bottom surface of the upper metal layer;
   a sidewall spacer surrounding an outer periphery of the top electrode, wherein the sidewall spacer has a spacer top surface;
   an etch stop layer disposed on top of an outer periphery of the spacer top surface and surrounding an outer periphery of the bottom surface of the upper metal layer; and
   further wherein the etch stop layer includes a lateral extension that overhangs the outer periphery of the spacer top surface and wherein a portion of the etch stop layer that extends beyond the outer periphery of the spacer top surface angles slightly down toward the lower metal layer.

2. The integrated circuit of claim 1, wherein the bottom surface of the upper metal layer is in contact with the top spacer surface.

3. The integrated circuit of claim 2, wherein a width of the bottom surface is less than a width of the top spacer surface.

4. The integrated circuit of claim 1, wherein the MTJ has sidewalls that are angled at an angle of other than 90-degrees as measured relative to a normal line passing through an upper surface of the bottom electrode.

5. The integrated circuit of claim 1, further comprising an additional portion of the etch stop layer disposed at an outer periphery of the bottom electrode.

6. A magnetoresistive random-access memory (MRAM) cell disposed on a semiconductor substrate, the MRAM cell including:
   a bottom electrode disposed over the semiconductor substrate;
   a magnetic tunneling junction (MTJ) disposed above the bottom electrode;
   a top electrode disposed over an upper surface of the MTJ, wherein the top electrode has an electrode top surface;
   a sidewall spacer surrounding an outer periphery of the top electrode, wherein the sidewall spacer has a spacer top surface;
   an etch stop layer disposed on top of an outer periphery of the spacer top surface, wherein the etch stop layer overhangs the outer periphery of the spacer top surface; and
   a metal line disposed over the top electrode and having a bottom surface in direct physical and electrical contact with the electrode top surface,
   wherein a width of the bottom surface of the metal line is less than a width of the top spacer surface.

7. The MRAM cell of claim 6, wherein the bottom surface of the metal line is in contact with the top spacer surface.

8. The MRAM cell of claim 6, wherein the MTJ has sidewalls that are angled at an angle of other than 90-degrees as measured relative to a normal line passing through an upper surface of the bottom electrode.

9. The MRAM cell of claim 6, wherein a portion of the etch stop layer that extends beyond the outer periphery of the spacer top surface angles slightly down toward the bottom electrode.

10. The MRAM cell of claim 6, further comprising an additional portion of the etch stop layer disposed at an outer periphery of the bottom electrode.

11. A memory cell, comprising:
    a top electrode disposed over an upper surface of a magnetic tunneling junction (MTJ), wherein the top electrode has an electrode top surface;
    a sidewall spacer surrounding an outer periphery of the top electrode, wherein the sidewall spacer has a spacer top surface;
    an etch stop layer disposed on top of an outer periphery of the spacer top surface, wherein the etch stop layer overhangs the outer periphery of the spacer top surface, further wherein a portion of the etch stop layer that extends beyond the outer periphery of the spacer top surface angles slightly downward; and
    a metal line disposed over the top electrode and having a bottom surface in direct physical and electrical contact with the electrode top surface.

12. The memory cell of claim 11, wherein the bottom surface of the metal line is in contact with the top spacer surface.

13. The memory cell of claim 11, wherein a width of the bottom surface of the metal line is less than a width of the top spacer surface.

14. The memory cell of claim 11, further comprising a bottom electrode disposed below the MTJ.

15. The memory cell of claim 14, wherein the MTJ has sidewalls that are angled at an angle of other than 90-degrees as measured relative to a normal line passing through an upper surface of the bottom electrode.

16. The memory cell of claim 14, further comprising an additional portion of the etch stop layer disposed at an outer periphery of the bottom electrode.

17. The memory cell of claim 14, wherein the etch stop layer includes a lateral extension that overhangs the outer periphery of the spacer top surface.

* * * * *